(12) United States Patent
Madurawe

(10) Patent No.: US 7,812,458 B2
(45) Date of Patent: Oct. 12, 2010

(54) PAD INVARIANT FPGA AND ASIC DEVICES

(75) Inventor: Raminda Udaya Madurawe, Sunnyvale, CA (US)

(73) Assignee: Tier Logic, Inc., Santa Clara, CA (US)

( * ) Notice: Subject to any disclaimer, the term of this patent is extended or adjusted under 35 U.S.C. 154(b) by 0 days.

(21) Appl. No.: 11/986,024

(22) Filed: Nov. 19, 2007

(65) Prior Publication Data

US 2009/0128188 A1    May 21, 2009

(51) Int. Cl.
*H01L 23/48* (2006.01)
*H03K 19/177* (2006.01)
*H01L 21/30* (2006.01)

(52) U.S. Cl. .......................... 257/777; 257/774; 326/40
(58) Field of Classification Search .................. 257/67, 257/206, 369, 777, 774; 326/38–41
See application file for complete search history.

(56) References Cited

U.S. PATENT DOCUMENTS

| | | |
|---|---|---|
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,191,241 A | 3/1993 | McCollum et al. |
| 5,216,636 A | 6/1993 | Runaldue |
| 5,343,406 A | 8/1994 | Freeman et al. |
| 5,347,519 A | 9/1994 | Cooke et al. |
| 5,488,316 A | 1/1996 | Freeman et al. |
| 5,563,526 A | 10/1996 | Hastings et al. |
| 5,581,501 A | 12/1996 | Sansbury et al. |
| 5,612,631 A | 3/1997 | Agrawal et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,781,031 A | 7/1998 | Bertin |
| 5,793,115 A * | 8/1998 | Zavracky et al. ............ 257/777 |
| 5,835,405 A | 11/1998 | Tsui et al. |
| 5,844,422 A | 12/1998 | Trimberger et al. |
| 5,880,598 A | 3/1999 | Duong |
| 5,943,574 A | 8/1999 | Tehrani et al. |
| 5,949,710 A | 9/1999 | Pass et al. |
| 5,949,719 A | 9/1999 | Clinton et al. |
| 6,005,806 A | 12/1999 | Madurawe et al. |
| 6,018,476 A | 1/2000 | Madurawe et al. |

(Continued)

OTHER PUBLICATIONS

Ashok K. Sharma, "Programmable Logic Handbook—PLDs, CPLDs, & FPGAs", 1998, pp. 99-171, McGraw-Hill, USA.

(Continued)

*Primary Examiner*—Vibol Tan
(74) *Attorney, Agent, or Firm*—Tran & Associates

(57) ABSTRACT

A three dimensional semiconductor device, comprising: a plurality of circuit blocks including programmable logic blocks having predetermined positions within the device; a plurality of pads having predetermined positions within the device; and a configuration memory circuit coupled to the programmable logic blocks having a plurality of fabricating methods without altering the predetermined positions of the pads and the circuit blocks.

11 Claims, 10 Drawing Sheets

U.S. PATENT DOCUMENTS

| | | |
|---|---|---|
| 6,097,211 A | 8/2000 | Couts-Martin et al. |
| 6,134,171 A | 10/2000 | Yamagata et al. |
| 6,134,173 A | 10/2000 | Cliff et al. |
| 6,191,614 B1 * | 2/2001 | Schultz et al. ............ 326/41 |
| 6,242,767 B1 | 6/2001 | How et al. |
| 6,259,271 B1 | 7/2001 | Couts-Martin et al. |
| 6,262,596 B1 * | 7/2001 | Schultz et al. ............ 326/41 |
| 6,275,064 B1 | 8/2001 | Agrawal et al. |
| 6,275,065 B1 | 8/2001 | Mendel |
| 6,331,784 B1 | 12/2001 | Mason et al. |
| 6,331,789 B2 | 12/2001 | Or-Bach |
| 6,337,579 B1 | 1/2002 | Mochida |
| 6,340,830 B1 | 1/2002 | Takemura |
| 6,353,562 B2 | 3/2002 | Bohm et al. |
| 6,420,925 B1 | 7/2002 | Fifield et al. |
| 6,448,808 B2 | 9/2002 | Young et al. |
| 6,480,027 B1 | 11/2002 | Ngai et al. |
| 6,496,887 B1 | 12/2002 | Plants |
| 6,504,742 B1 | 1/2003 | Tran et al. |
| 6,515,511 B2 | 2/2003 | Sugibayashi et al. |
| 6,525,953 B1 | 2/2003 | Johnson |
| 6,551,857 B2 | 4/2003 | Leedy |
| 6,582,980 B2 | 6/2003 | Feldman et al. |
| 6,613,611 B1 | 9/2003 | How et al. |
| 6,614,259 B2 | 9/2003 | Couts-Martin et al. |
| 6,627,985 B2 | 9/2003 | Huppenthal et al. |
| 6,737,675 B2 | 5/2004 | Patel et al. |
| 6,738,962 B1 | 5/2004 | Flaherty et al. |
| 6,798,240 B1 | 9/2004 | Pedersen |
| 6,812,731 B1 | 11/2004 | Trimberger |
| 6,911,730 B1 | 6/2005 | New |
| 6,946,330 B2 | 9/2005 | Yamazaki et al. |
| 6,954,084 B2 | 10/2005 | Islam |
| 6,992,503 B2 | 1/2006 | Madurawe |
| 6,998,722 B2 | 2/2006 | Madurawe |
| 7,019,557 B2 | 3/2006 | Madurawe |
| 7,030,651 B2 | 4/2006 | Madurawe |
| 7,064,018 B2 | 6/2006 | Madurawe |
| 7,064,579 B2 | 6/2006 | Madurawe |
| 7,084,666 B2 | 8/2006 | Madurawe |
| 7,112,994 B2 | 9/2006 | Madurawe |
| 7,176,713 B2 | 2/2007 | Madurawe |
| 7,253,659 B2 | 8/2007 | Madurawe |
| 7,268,580 B2 | 9/2007 | Madurawe |
| 2001/0003428 A1 | 6/2001 | Or-Bach |
| 2001/0028059 A1 | 10/2001 | Emma et al. |
| 2001/0047509 A1 | 11/2001 | Mason et al. |
| 2002/0177260 A1 | 11/2002 | Matsumoto |
| 2002/0186044 A1 | 12/2002 | Agrawal et al. |
| 2003/0001615 A1 | 1/2003 | Sueyoshi et al. |
| 2003/0023762 A1 | 1/2003 | Dhir et al. |
| 2003/0085733 A1 | 5/2003 | Pugh et al. |
| 2003/0227056 A1 | 12/2003 | Wang et al. |
| 2004/0178819 A1 | 9/2004 | New |
| 2005/0023656 A1 | 2/2005 | Leedy |
| 2006/0195729 A1 | 8/2006 | Huppenthal |
| 2006/0225020 A1 * | 10/2006 | Chandrakasan et al. ....... 716/17 |
| 2009/0146189 A1 * | 6/2009 | Madurawe .................. 257/203 |

OTHER PUBLICATIONS

Alexander, et al., "Three-Dimensional Field-Programmable Gate Arrays", Proceedings of the $8^{th}$ Annual IEEE International ASIC Conference and Exhibit, 1995, pp. 253-256.

Chen Dong et al., "3-D nFPGA: A reconfigurable architecture for 3-D CMOS/Nanomaterial Hybrid Digital Circuits", IEEE Trans. Circuits and Systems, vol. 54, No. 11, Nov. 1, 2007 (pp. 2489-2501).

* cited by examiner $O_1 = A*B*/C + /A*B$
$O_2 = /A*B + /B*C$
$O_3 = A*B*/C + /A*B + C$
$O_4 = C$

PAD INVARIANT FPGA AND ASIC DEVICES

This application is related to application Ser. No. 10/267,484 (now abandoned), application Ser. No. 10/267,511 (now U.S. Pat. No. 6,747,478), and application Ser. No. 10/267,483, all of which were filed on Oct. 8, 2002, and application Ser. No. 10/762,627 (now U.S. Pat. No. 7,018,875) filed on Jan. 23, 2004, application Ser. No. 10/413,809 (now U.S. Pat. No. 6,855,988) filed on Apr. 14, 2003, application Ser. No. 10/413,810 (now U.S. Pat. No. 6,828,689) filed on Apr. 14, 2003, all of which have as inventor Mr. R. U. Madurawe and the contents of which are incorporated-by-reference.

This application is also related to application Ser. No. 11/986,023 entitled "Pads and Pin-Outs in Three Dimensional Integrated Circuits" filed concurrently, and lists as inventor Mr. R. U. Madurawe, the contents of which are incorporated-by-reference.

BACKGROUND

The present invention relates to pad invariant integrated circuits.

Integrated circuits (ICs) comprise complex circuit blocks, each circuit block further comprising a plurality of transistors. The transistors are normally constructed on a semiconductor substrate. Metal interconnects couple transistors. Pad structures are formed within the IC to couple the IC to external devices. A pad structure includes a metal pad to facilitate bonding of the IC in a printed-circuit-board (PCB). Within the IC, the metal pad couples to one or more circuits, typically input circuits or output circuits, to facilitate coupling of the external device to the IC. Thus a pad in a first IC couples to a pad in a second IC. Pad structures occupy a significant silicon area as each pad structure includes a metal pad, input or output buffers, electro-static-discharge (ESD) circuits, control circuits, clock circuits, registers, etc. Metal pads itself is very large to facilitate bonding. Thus the pad cost for a given plurality of ICs required in a reference system design is significant. Furthermore as pads couple between IC's, the I/O characteristics are extremely important to interface devices.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. Further, should bugs exist in the custom or semi-custom ICs, the design/fabrication cycle has to be repeated, further aggravating the time to market and engineering cost. As a result, ASICs serve only specific applications and are custom built for high volume and low cost applications.

Another type of semi custom device called a Gate Array customizes modular blocks at a reduced NRE cost by synthesizing the design using a software model similar to the ASIC. The missing silicon level design verification results in multiple spins and lengthy design iterations.

In recent years there has been a move away from custom or semi-custom ICs towards field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this programmability is expensive in terms of silicon real estate, but reduces design cycle and upfront NRE cost to the designer. Most FPGA solutions mandate an external memory (boot-ROM) to store configuration data, thus exacerbating the solution cost. The FPGA to memory interface is via high silicon consuming pad structures.

FPGAs offer the advantages of low non-recurring engineering costs, fast turnaround (designs can be placed and routed on an FPGA in typically a few minutes), and low risk since designs can be easily amended late on in the product design cycle. It is only for high volume production runs that there is a cost benefit in using the more traditional approaches. However, the conversion from an FPGA implementation to an ASIC implementation typically requires a complete redesign. Such redesign is undesirable in that the FPGA design effort is wasted. An ASIC does not require configuration data and does not interface with a boot-ROM.

Compared to PLD and FPGA, an ASIC has hard-wired logic connections, identified during the chip design phase, and need no configuration memory cells. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage).

There is no convenient migration path from a PLD or FPGA used as a design verification and prototyping vehicle to the lower die size ASIC. All of the SRAM or Anti-fuse configuration bits and programming circuitry has no value to the ASIC. Programmable module removal from the PLD or FPGA and the ensuing layout and design customization is time consuming with severe timing variations from the original design. The pad structures play a major role in FPGA I/O interface characteristics, and matching those in a design conversion is not a simple exercise.

FIG. 1A shows prior-art arrangement of a first IC 100 coupled to a second IC 101. The first IC 100 includes a first transistor layer 102 having one or more circuit blocks 104. IC 100 includes one or more metal pads 103, each pad coupled to a circuit block such as 104. Typically, metal pad 104 is located substantially above the transistor layer 102. When IC 100 is an FPGA, circuit blocks 104 include I/O blocks, programmable logic blocks, and configuration memory. Data at pad 103 is received by a first circuit block 104 interfacing the pad, and then programmed into memory elements within configuration circuits. Second IC 101 includes a second transistor layer 106 having one or more circuit blocks 108. Each metal pad 107 in IC 101 is coupled to a circuit block such as 108. When IC 101 is a memory device, circuit blocks 107 include I/O blocks, memory arrays, and sense amplifiers. Data received/transmitted at pad 107 is handled by a circuit block 108 interfacing the pad. Thus pads 103 and 107 form a bus structure for data transfer between devices. FIG. 2A shows a second embodiment of prior art device coupling. In FIG. 1B, pads 117 and 113 are first coupled to a common metal trace 120. Both ICs incur a large Si area for I/O's, and have limited pads to connect to each other.

SUMMARY

In one aspect, a pad system is provided for a three-dimensional semiconductor device includes a first module layer having a plurality of circuit blocks; and a second module layer positioned substantially above the first module layer, including a plurality of configuration circuits to control a portion of the circuit blocks.

In another aspect, a three dimensional semiconductor device comprises: a substrate including a plurality of circuits; a plurality of pads, each pad coupled to a said circuit; and a memory array positioned above or below the substrate coupled to a said circuit to program the memory array.

In yet another aspect, a semiconductor device includes a plurality of pads; a first layer including a memory array; and a second layer including input/output circuits coupled to the pads and positioned above or below the first layer, the second layer including one or more circuits coupled to the memory array to program the memory array.

Implementations of the above aspect may include one or more of the following. The memory array includes a memory element coupled to one or more programmable logic circuits on the second layer to configure the programmable logic circuits. The memory array comprises one of: random access memory to form an FPGA, a metal mask to form an ASIC. The pads are coupled to a ball grid array. The pads are coupled to leads in a package. The pads are positioned along a perimeter of a device. The pads are positioned on the top or bottom surface on a device. The pads have a predetermined position within the device. The second layer includes an input buffer to receive data from the pad to configure the memory array. The memory array can include fuses, antifuses, SRAM cells, DRAM cells, metal optional links, EPROMs, EEPROMs, flash, resistance modulating elements, magneto-electric elements, photo-electric elements and ferro-electric elements. The memory array controls a plurality of logic circuits positioned in a predetermined position. The area of the memory array substantially overlaps the area of one or more programmable logic circuits. The area of the memory array substantially under-laps the area of one or more programmable logic circuits. The memory array and the pads are positioned substantially above the programmable logic circuits. The memory array and the pads are positioned substantially below the programmable logic circuits. The second layer includes drivers to write data to the memory array. The first layer comprises drivers to write data to the memory array. The first layer can have sense amplifiers to read data from the memory array. The second layer can also have sense amplifiers to read data from the memory array. A driver circuit can be connected to the memory array to configure the memory array. The memory array can include one or more memory elements each coupled to one or more programmable logic elements to configure the programmable logic element.

In yet another aspect, a method for fabricating a 3D device includes forming a first layer having a memory array; forming a second layer above or below the first layer, the second layer including one or more circuits coupled to the memory array to configure the memory array; and forming a plurality of pads, wherein one or more pads are coupled to the second layer to provide input/output for the 3D device to program the memory array.

Implementations of the method may include one or more of the following. The memory array can be replaced by a metal pattern to convert an FPGA to an ASIC. The memory array can be programmed with a driver on the first layer. One or more programmable logic elements can be configured with configuration data stored in the memory array. The process includes depositing thin film transistors on the first layer. The process also includes depositing the first layer above a substrate. The second layer can be deposited above a substrate.

Other implementations may include one or more of the following. The configuration circuits can be memory elements. Each memory element can be a transistor or a diode or a group of electronic devices. The memory elements can be thin film devices such as thin film transistors (TFT) or diodes. The memory element can be selected from the group consisting of volatile or non volatile memory elements. The memory element can also be selected from the group of fuses, antifuses, SRAM cells, DRAM cells, metal optional links, EPROMs, EEPROMs, flash, resistance modulating elements, magneto-electric elements, photo-electric elements and ferro-electric elements. One or more redundant memory cells can be provided for controlling the same circuit block. A third module layer can be formed substantially above the first and second module layer, wherein interconnect and routing signals are formed to connect the circuit blocks within the first and second module layers. The third module layer can be formed substantially below the first and second module layer. Alternatively, third and fourth module layers, wherein interconnect and routing signals are formed can be positioned above and below the second module layer respectively. The circuit block can contain a programmable logic block which responds to input data signals and develops corresponding complete or partial output logic signals, and registers to store the logic signals and either outputting them to output terminals or returning them as inputs to additional programmable logic blocks. The programmable logic blocks can contain pass gate logic, multiplexer logic, truth table logic, or AND/OR logic blocks.

Implementations of the above aspect may further include one or more of the following. The memory can be implemented using a TFT process technology that contains one or more of replaceable Fuses, Anti-fuses and SRAM elements. The process implementation is possible with any process technology where EPROM, EEPROM, Flash, Ferro-Electric or any other programmable element is vertically integrated.

In a second aspect, a multi-dimensional semiconductor device includes a first module layer having a plurality of circuit blocks formed on a first plane; and a second module layer formed on a second plane, including a plurality of configuration circuits formed to control a portion of the circuit blocks.

In a third aspect, a system includes a processor; data storage devices coupled to the processor; and a three-dimensional semiconductor device coupled to the processor, the 3D semiconductor device having a first module layer having a plurality of circuit blocks formed on a first plane and a second module layer formed on a second plane, including a plurality of configuration circuits formed to control a portion of the circuit blocks.

In a fourth aspect, a multi-dimensional semiconductor device includes a plurality of circuit blocks formed on a substrate; and a plurality of configuration circuits formed substantially above the substrate to control at least one circuit block.

Implementation of the fourth aspect may include one or more of the following. The configuration circuit includes a predetermined conductive pattern to control the circuit blocks. The configuration circuits can be memory elements with one device selected from the following: diode, transistor, thin film device, thin film resistor, thin film capacitor, thin film transistor (TFT). The memory element can be selected from the group consisting of volatile or non volatile memory elements. The memory element can also be selected from a group of fuse links, antifuse capacitors, SRAM cells, DRAM cells, metal optional links, EPROM cells, EEPROM cells, flash cells, resistance modulating elements, magneto-electric elements, photo-electric elements and ferro-electric elements.

Implementations of the above aspects may include one or more of the following. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks. There is no change to pads and circuits coupled to pads in the change from FPGA to ASIC—thus no I/O characteristics are altered. Peripheral devices couple to FPGA and ASIC canonicals without changes in interface properties.

A series product families can be provided with a modularized programmable element in an FPGA version followed by a turnkey custom ASIC with the same base die with 1-2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

Advantages of the IC may include one or more of the following. An easy turnkey customization of an ASIC from an original smaller PLD or FPGA would greatly enhance time to market, performance, low cost and better reliability.

DESCRIPTION

Figure 1A:
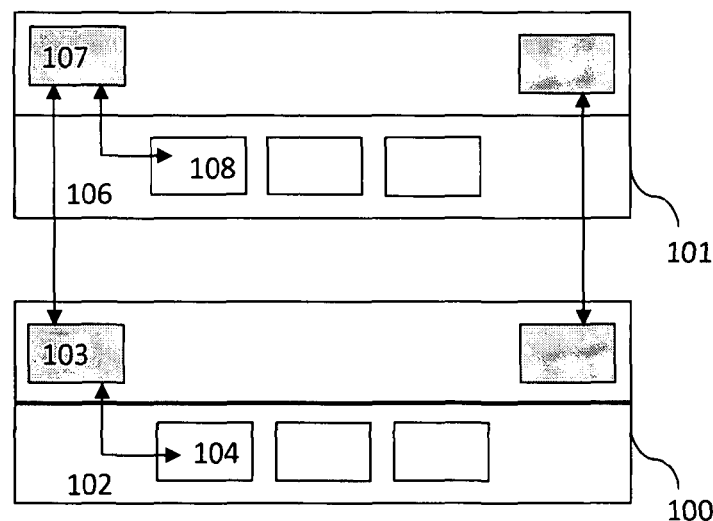
FIGS. 1A & 1B show pads & pin-outs in prior art ICs.
Figure 1B:
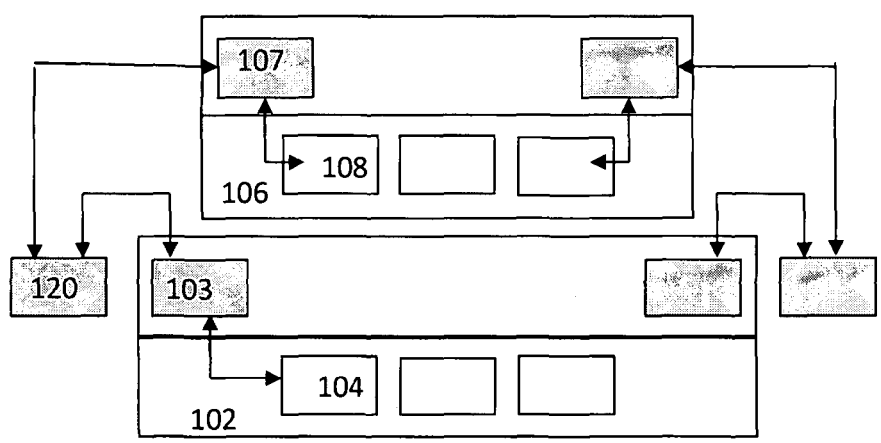

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms "wafer" and "substrate" used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term "conductor" is understood to include semiconductors, and the term "insulator" is defined to include any material that is less electrically conductive than the materials referred to as conductors. Thus every IC includes a substrate.

The term "module layer" includes a structure that is fabricated using a series of predetermined process steps. The boundary of the structure is defined by a first process step, one or more intermediate process steps, and a final process step. The resulting structure is formed on a substrate. A cross-section of a semiconductor device may be used to identify module layer boundaries. It is understood that some processing steps such as resist patterning and cleans do not leave structural imprints to a module layer. It is further understood that some processing steps such deposition and etching leave structural imprints in a module layer. Thus a module layer includes processing steps that may or may not make a structural imprint.

The term "pass-gate" and "switch" refers to a structure that can pass a signal when on, and block signal passage when off. A pass-gate connects two points when on, and disconnects two points when off. A pass-gate couples two points when on, and decouples two points when off. A pass-gate can be a floating-gate transistor, an NMOS transistor, a PMOS transistor or a CMOS transistor pair. The gate electrode of transistors determines the state of the connection. A CMOS pass-gate requires complementary signals coupled to NMOS and PMOS gate electrodes. A control logic signal is connected to gate electrode of a transistor for programmable logic. A pass-gate can be a conductivity modulating element. The conductivity may be made to change between a sufficiently conductive state and a sufficiently nonconductive state by a configuration means. The configurable element may comprise a chemical, magnetic, electrical, optical, and ferroelectric or any other property that allows the element to change its conductivity between said two states.

The term "configuration circuit" includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. A memory element in the configuration circuit is coupled to a programmable circuit block to configure the circuit block. Thus a configuration circuit is different from traditional circuits in memory devices. Configuration circuit does not include the logic pass-gate controlled by said memory element. In one embodiment, the configuration circuit includes a plurality of memory elements to store instructions to configure an FPGA. In another embodiment, the configuration circuit includes a first selectable configuration where a plurality of memory elements is formed to store instructions to control one or more circuit blocks. The configuration circuit includes a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuit includes a predetermined conductive pattern comprising one or more of via, resistor, capacitor or other suitable ROM circuits in lieu of RAM circuits to control circuit blocks. Configuration circuit should not be confused with memory circuits in memory devices.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate.

Figure 2A:
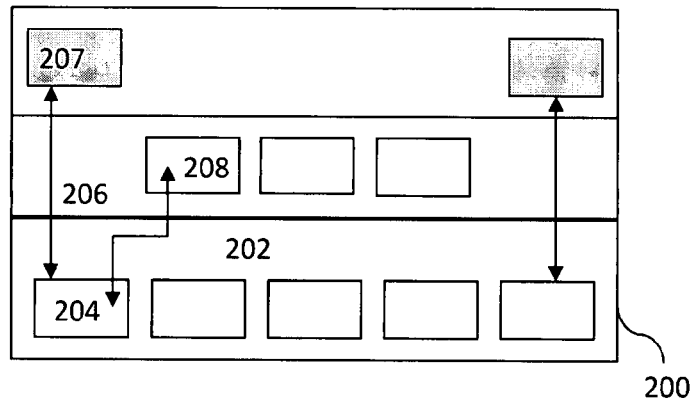
FIG. 2A shows a cross sectional view of a first embodiment of a 3D integrated circuit.

FIG. 2A shows a cross sectional view of a first embodiment of an integrated circuit that can be select-ably fabricated as either an FPGA or an ASIC. In this embodiment, a three-dimensional semiconductor device 200 is shown. The device 200 includes a first module layer 202 having a plurality of circuit blocks 204 embedded therein. Module 202 includes transistors. Module 202 may be constructed on a semiconductor substrate layer or thinned down semiconductor substrate layer comprising high mobility devices. Module 202 may be constructed on a SOI substrate comprising high mobility transistors. The first module layer may include one or more metal layers. The device 200 also includes a second module layer 206 formed substantially above the first module layer 202. The second module layer may be deposited or bonded or glued on to first module layer. The second module layer 206 includes a plurality of circuit blocks 208 embedded therein. The second module layer may be constructed on a second semiconductor substrate, thinned down semiconductor layer or an SOI substrate. The second module may be positioned above metal and require low temperature processing. The second module layer transistors may have a lower mobility compared to the first module layer transistors. The second module transistors may be thin-film transistors (TFT's). Circuit blocks 208 may include one or more configuration circuits. Generic configuration circuits 208 are formed to store instructions to control a portion of the circuit blocks 204. In the embodiment of FIG. 2A, wiring/routing interconnects (in module layers 202 and 206, not shown) are formed to couple circuit blocks 204, circuit blocks 208 and pads 207. One or more pads 207 may not directly connect to circuit block 208. Thus no ESD structures or I/O buffers (i.e. high current circuits) may be required in circuits 208, which allows transistor layer 206 to accommodate low mobility transistors. Lower mobility transistors offer greater flexibility over higher mobility transistors to be fabricated within the second module layer 206. Furthermore, I/O Memory data received at pad 207 is first received by circuit blocks 204 in first module layer 202, and then written into configuration circuits 208, preserving high data interface as well as high circuit density. Circuits 208 may further couple to circuits 204 in the full construction of the FPGA or ASIC.

Figure 2B:
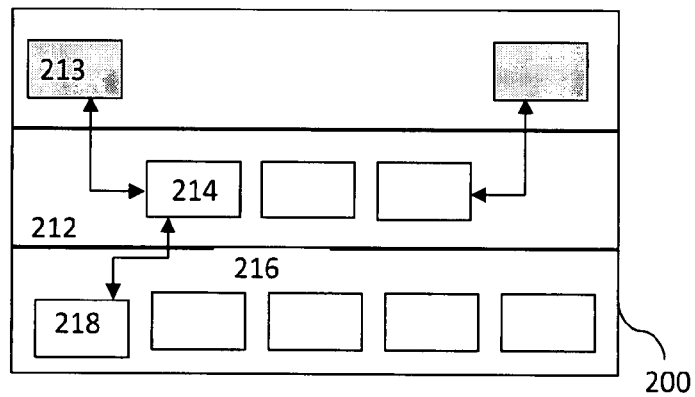
FIG. 2B shows a cross sectional view of a second embodiment of a 3D integrated circuit.

FIG. 2B shows a cross sectional view of a second embodiment of an integrated circuit that can be select-ably fabricated as either an FPGA or an ASIC. In this embodiment, a three-dimensional semiconductor device 220 is shown. The device 220 includes a first module layer 212 having a plurality of circuit blocks 214 embedded therein. Module 212 includes transistors. Module 212 may be constructed on a semiconductor substrate layer or thinned down semiconductor substrate comprising high mobility devices. Module 212 may be constructed on a SOI substrate comprising high mobility transistors. The first module layer may include one or more metal layers. The first module layer may 212 be laser annealed to improve the mobility of transistors. The device 220 also includes a second module layer 216 formed substantially below the first module layer 212. The second module layer may be deposited or bonded or glued on to first module layer. The second module layer 216 includes a plurality of circuit blocks 218 embedded therein. The second module layer may be constructed on a second semiconductor substrate, thinned down semiconductor layer or an SOI substrate. The second module may be positioned below or above metal and may require low temperature processing. The second module layer transistors may have a lower mobility compared to the first module layer transistors. The second module transistors may be thin-film transistors (TFT's). Circuit blocks 218 may include one or more configuration circuits. In the embodiment of FIG. 2B, wiring/routing interconnects (in module layers 212 and 216, not shown) are formed to couple circuit blocks 214, circuit blocks 218 and pads 213. One or more pads 213 may not directly connect to circuit block 218. Thus no ESD structures or I/O buffers (i.e. high current circuits) may be required in circuits 218, which allows transistor layer 216 to accommodate low mobility transistors. Lower mobility transistors offer greater flexibility over higher mobility transistors to be fabricated within the second module layer 216. Furthermore, I/O Memory data received at pad 213 is first received by circuit blocks 214 in first module layer 212, and then written into configuration circuits 218, preserving high data interface as well as high circuit density. Circuits 218 may further couple to circuits 214 in the full construction of the FPGA or ASIC.

Figure 3A:
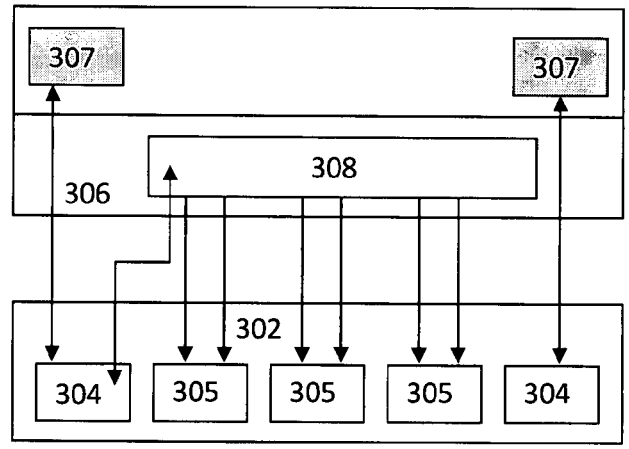
FIG. 3A shows a cross sectional view of a first embodiment of a 3D FPGA.
Figure 3B:
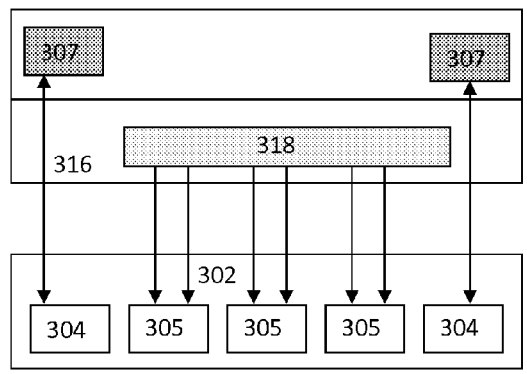
FIG. 3B shows a cross sectional view of the first embodiment FPGA converted to an ASIC.

FIGS. 3A and 3B show an FPGA conversion to an ASIC. FIG. 3A shows a cross-sectional view of the FPGA. In that, pads 307 interfaces with circuits 304 in module layer 302. Module layer 302 may is a transistor layer as it comprises transistors, the transistors forming one or more circuit blocks 404 and one or more programmable circuit blocks 305. In the FPGA, module layer 306 comprises a second transistors fabricated on a thin-film layer positioned substantially above (or below, as in FIG. 2B) the module layer 302. The configuration circuit includes a plurality of memory elements to store configuration data. Each memory element is coupled to one or more programmable logic elements within circuit blocks 305, the memory data programming the logic elements and routing elements to a user specification. Data stored in the configuration circuits can be changed by the user, thus altering the programmable logic application. Memory data in configuration circuit 308 may be Random-Access-Memory (RAM) such as SRAM, DRAM, NVRAM etc. Memory data in configuration circuit 308 may be Programmable Read-Only- Memory (ROM) such as EPROM, EEPROMR, Fuses, Antifuses etc. Such products offer changeable memory content in the configuration circuit for a user to select a desire memory pattern to program the FPGA. The FPGA issues a command requesting configuration data from an external boot-ROM. The data stream for configuration memory may enter the device thru one or more pads such as 307. A said pad 307 is coupled to circuit block 304 in the module layer 302. The data may enter as a single-bit stream, or as an 8-bit (byte) stream or in any other standard data transfer format. The date may be routed by circuit blocks 304 in module layer 302 to configuration circuits 308 in module layer 306. The configuration data is stored within memory elements located in the configuration circuits 308. Thus configuration data resides within the FPGA 200, in the second module layer 306, to program the programmable logic content 305 in module layer 302 during normal operation of the FPGA. No pads are required to interface directly with configuration circuits in module 306 to read or write memory data.

FIG. 3B shows a cross-sectional view of the device in FIG. 3A in ASIC mode. The base die including transistor module layer 302 and pads 307 are identical to the FPGA in FIG. 3A. Thus the pad interface circuits to the FPGA & ASIC are identical, and all I/O characteristics are identical between the two. A substitution of FPGA device by the ASIC device has no impact on interface requirements with peripheral devices coupled to either of the devices. In the ASIC in FIG. 3B, module layer 316 now includes a configuration circuit 318 comprising a metal pattern in lieu of the memory elements of 308 in the FPGA. A metal pattern can provide ROM elements by simply having hard wired power or ground connections instead of memory storage units. Thus every memory element in FPGA configuration circuit 308 having a data one is replaced by wire connections to power in ASIC configuration circuit 318, and every memory element in FPGA configuration circuit 308 having a data zero is replaced by wire connections to ground in ASIC configuration circuit 318. A metal pattern 318 is simpler to construct, cheaper and more reliable compared to complex memory elements embedded in circuits 308. Additionally, as no configuration data external to ASIC in FIG. 3B is required, the ASIC is adjusted to simply not request external configuration data, or ignore an incoming bit-stream of data. These changes are included in circuit blocks 304 from the very beginning in anticipation of the FPGA to ASIC conversion.

Figure 3C:
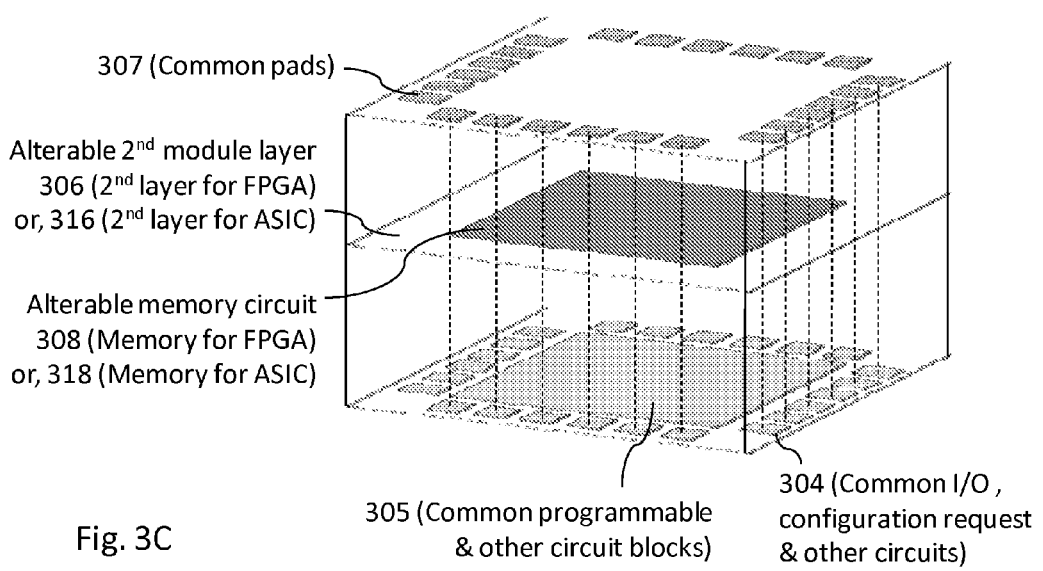
FIG. 3C shows a 3D view of the FPGA and ASIC embodiments.

FIG. 3C shows a 3-dimensional view of either the FPGA or the ASIC constructed by alterable memory module, wherein pads are invariant to the change. In FIG. 3C, a semiconductor device, comprises: a plurality of pads 307 having predetermined positions; a first layer including a plurality of circuit blocks (IO circuit blocks 304, programmable circuit blocks 305, and other circuit blocks) having predetermined positions, a said circuit block (such as 304) coupled to a said pad 307; and a second layer (306 or 316) positioned above or below the first layer including a memory array (308 or 318) coupled to one or more of said circuit blocks 305, wherein the second layer comprises a plurality of configurations (such as 306 to form an FPGA, and 316 to form an ASIC) without altering the predetermined positions of circuit blocks 304, 305 and pads 307. FIG. 3C does not show all the metal layers constructed between the first layer, the second layer and the pad layer. In a typical process, there are 10 or more such metal layers. In the circuit blocks 305 & 304 there are programmable logic circuits and the memory array 308 comprises memory elements, a said memory element coupled to a said programmable logic circuit to configure the programmable logic circuit. As the control signals are vertical (compared to signal paths that run in horizontal wires) there is no physical impact to locations of circuits 304, 305 and pads 307 if the memory 308 is altered to 318 within the memory plane. Thus in the 3D device, pads that are coupled to power or ground supply voltages remain the same for either memory configurations. Furthermore a pad 307 coupled to an Input/Output (I/O) circuit block 304 in the first layer has the same I/O and pad coupling no matter what the memory implementation is. Thus the I/O characteristic is invariant to memory array configurations. It is easily seen that the memory array could include any one of fuses, antifuses, SRAM cells, DRAM cells, metal optional links, EPROMs, EEPROMs, flash, resistance modulating elements, magneto-electric elements, photo-electric elements or ferro-electric elements.

Figure 4A:
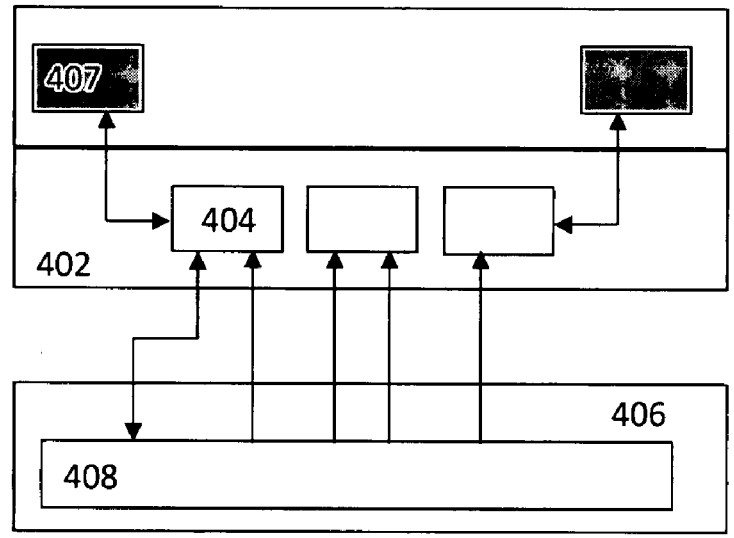
FIG. 4A shows a cross sectional view of a second embodiment of a 3D FPGA.
Figure 4B:
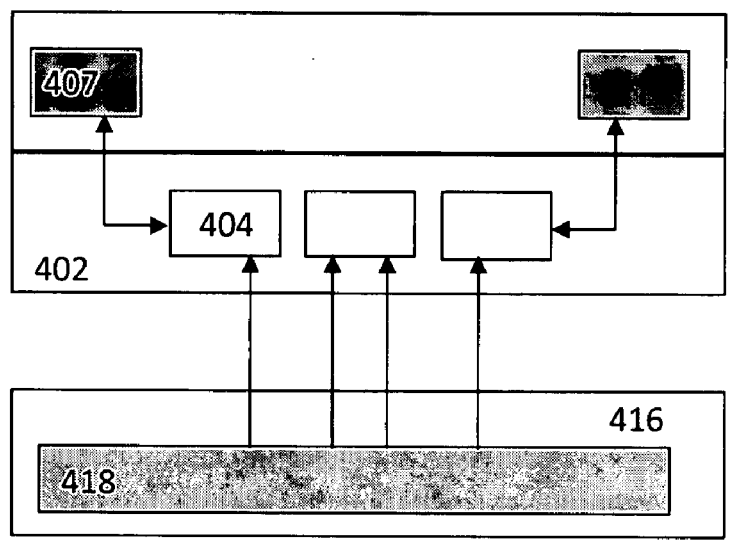
FIG. 4B shows a cross sectional view of the second embodiment FPGA converted to an ASIC.

FIGS. 4A and 4B show another embodiment of convertible FPGA and ASIC devices. In FIG. 4, the configuration layer (406 in FPGA FIG. 4A, and 416 in ASIC FIG. 4B) is positioned below the circuits layer 402 and coupled to the circuit layer 402. The operation and conversion of FPGA in FIG. 4A and ASIC in FIG. 4B are identical to the discussion related to FIG. 3 and not repeated. The devices shown in FIG. 4 may be constructed as monolithic devices, or separate die elements attached to form a 3D device.

Figure 5A:
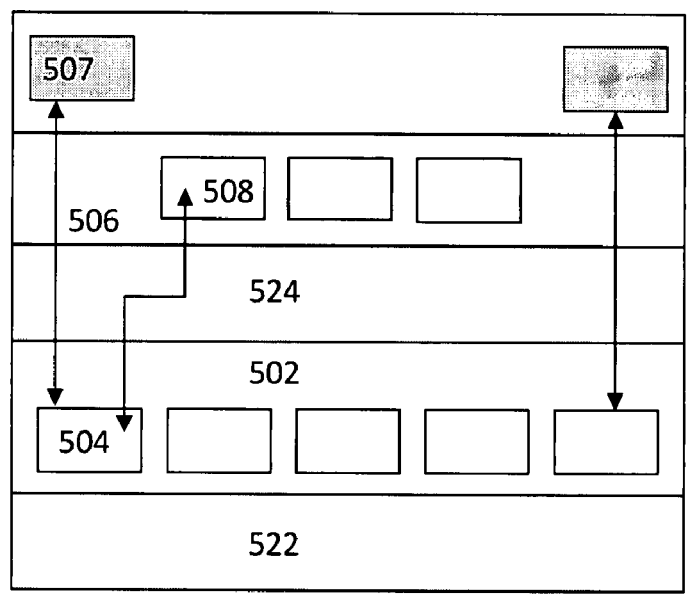
FIGS. 5A & 5B show cross sectional views of modularized 3D devices.
Figure 5B:
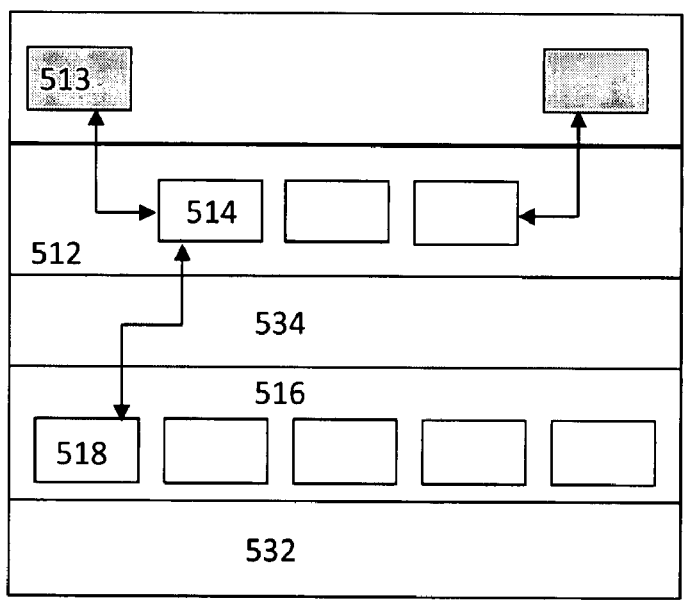

FIG. 5A and FIG. 5B show cross sectional views of FPGA in FIG. 4A and ASIC in FIG. 4B when constructed as monolithic devices. In FIG. 5A FPGA, module layer 524 is positioned between module layer 502 comprising circuit blocks 504 and module layer 506 comprising circuit blocks 508. Module layer 524 may include one or more metal layers required to form at least a portion of interconnects to construct the IC. Module layer 524 may be positioned above module layer 506, or below module layer 502. In the embodiment shown, module layer 502 is constructed on a substrate layer 522, which acts to dissipate thermal energy during normal operation of the device. Module layer 522 may include a heat sink, or coupled to a heat sink to dissipate power. In FIG. 5B ASIC, the metal interconnects in module layer 534 are identical to metal interconnects in module layer 524 of the FPGA. This no interconnect related timing parameters change between the two devices. memory elements in circuit blocks 514 are changed to metal patterns to freeze a selected memory content from the FPGA configuration memory. The coupling of memory to configure logic remains identical, preserving identical-bit pattern designs between the two designs. Similarly, the module layer 532 is also identical to module layer 522, thereby eliminating thermal variations between the two devices. Finally, the pads 507 and their locations in FIG. 5A are identical to pads 513 and their locations in FIG. 5B—hence the package encapsulating the device is identical between the two devices. The user encounters no pin-out change, no I/O characteristic change, and no configuration data change in the conversion of 3D FPGA device to the 3D ASIC device.

Fabrication of the IC shown in FIG. 5A also follows a modularized device formation. Formation of module layers 522, 502, 524 including transistors in circuit blocks 504 and routing wires in module layer 524 is by utilizing a standard logic process flow used in a standard ASIC fabrication. For the FPGA of FIG. 5A, extra processing steps used for module layer 506 circuit blocks 508 fabrication are inserted into the logic flow after module layer 524 is constructed. This includes fabrication steps for memory elements embedded in the configuration circuits. For the ASIC of FIG. 5A, simpler metal pattern processing steps are substituted to construct module layer 506. A significant benefit with this manufacturing scheme is that all the masks associated with module layers 522, 502 and 524 are identical for the FPGA version as well as the ASIC version, saving considerable NRE costs associated with mask costs. Metal pads and pad masks are also identical between the two devices. A full disclosure of the vertical integration of the TFT module using extra masks and extra processing is in the incorporated by reference applications disclosed.

Fabrication of the IC shown in FIG. 5B also follows a modularized device formation. A first die element of the device is formed by constructing circuits 518 in module 516 on a substrate layer 532. Then one or more metal interconnects are formed within module layer 516. A second die element is formed on an SOI material. First circuits 514 are formed on the SOI. Then one or more metal layers are formed in the module layer 534 above transistors module layer 512. The second die element is turned up-side-down such that module layer 534 is positioned below module layer 512. The two die elements are either bonded or glued such that metal connects metal within module layer 534. The back-side substrate in second die module is polished (removed) to expose the insulator. Pads are formed and coupled to circuit blocks 514. It is understood that coupling of pads 513 to circuits 514 may utilize one or more metal layers in module 534. One familiar in the art may define many alternative variations to couple a first transistor module layer with a second transistor module layer maintaining a single pad structure for both module layers.

During the customization from FPGA to ASIC, the base die and the data in those remaining mask layers do not change making the logistics associated with chip manufacture simple. Removal of the SRAM (or any other memory) module provides a low cost standard logic process for the final ASIC construction with the added benefit of a smaller die size. In a first embodiment, the design timing is unaffected by this migration as lateral metal routing and silicon transistors are untouched. In a second embodiment the ASIC timing is deliberately made faster by reducing wire loading and resistances associated with metal traces. In a third embodiment the metal trace loading and resistance is reduced to obtain a significant power reduction in the ASIC migration. In all cases, software verification and the original FPGA design methodology provide a guaranteed final ASIC solution to the user. A full disclosure of the ASIC migration from the original FPGA is in the co-pending incorporated by reference applications discussed above.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed to store instructions to control a portion of the circuit blocks.

Next, details of the circuit blocks 204, the configuration circuit 208, and the wiring and/or routing circuit 524 in FIGS. 2A & 5A respectively are detailed.

Figure 6A:
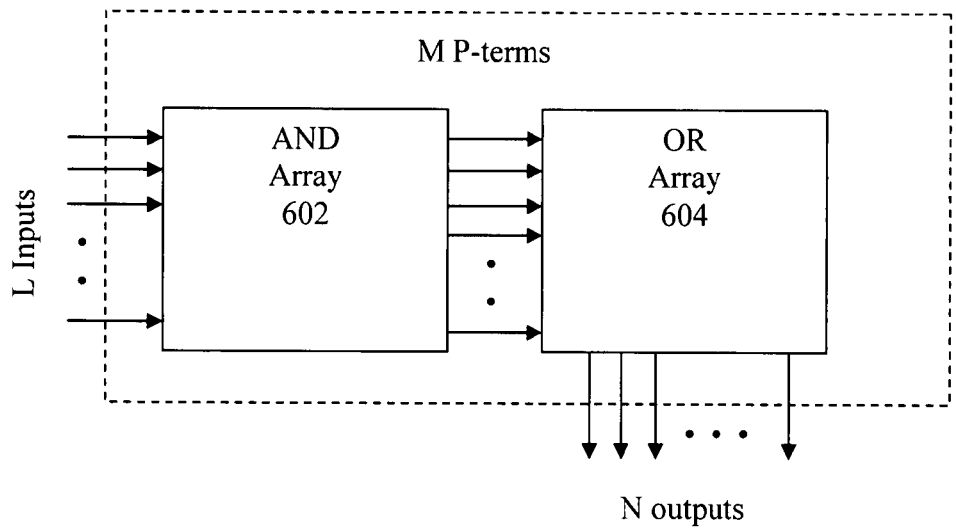
FIG. 6A shows an exemplary AND-OR PLD Architecture.
Figure 6B:
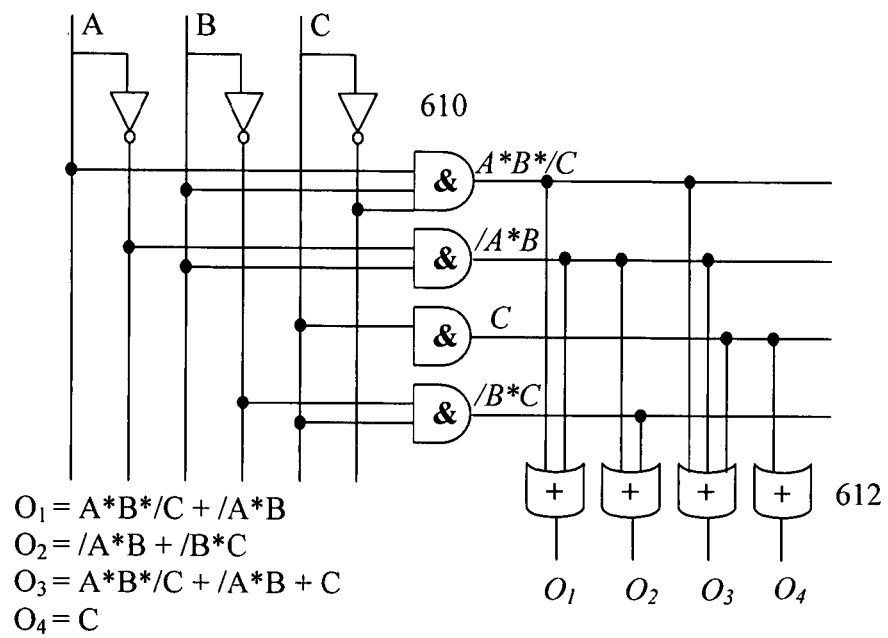
FIG. 6B shows an exemplary AND-OR array gate realization of PLD.

A variety of digital or analog circuits can be used in circuit blocks 204. These circuit blocks include programmable logic blocks to allow user customization of logic. In one embodiment, programmable logic blocks are provided to respond to input data signals. The programmable logic blocks develop corresponding complete or partial output logic signals. Registers are used to store the output logic signals and either outputting them to output terminals or returning them as inputs to additional programmable logic blocks. The registers themselves can be programmable, allowing those to be configured such as T flip-flops, JK flip-flops, or any other register. The logic blocks may contain no registers, or the registers may be programmed to be by-passed to facilitate combinational logic implementation. The programmable logic block can be selected from one of a pass gate logic, a multiplexer logic, a truth table logic, or an AND/OR logic. FIG. 6A shows an exemplary AND-OR PLD Architecture. AND and OR arrays 602 and 604 contain user configurable programmable elements. FIG. 6B shows an exemplary AND-OR array gate realization of a three input, four P-term, four output PLD. The AND and OR array 610-612 are shown programmed to a specific pattern.

Figure 7A:
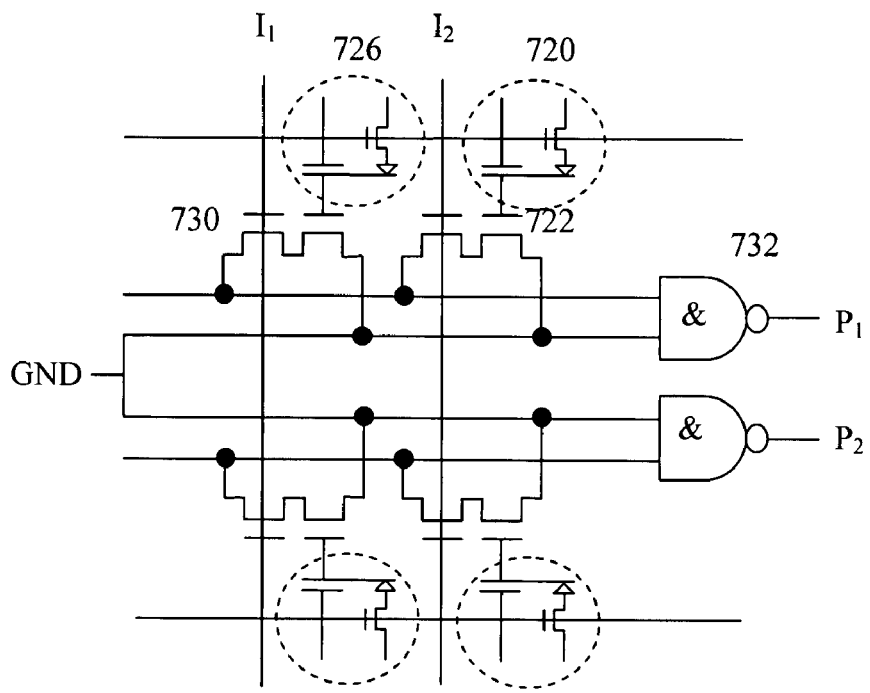
FIG. 7A shows one EEPROM implementation of a P-Term logic array.
Figure 7B:
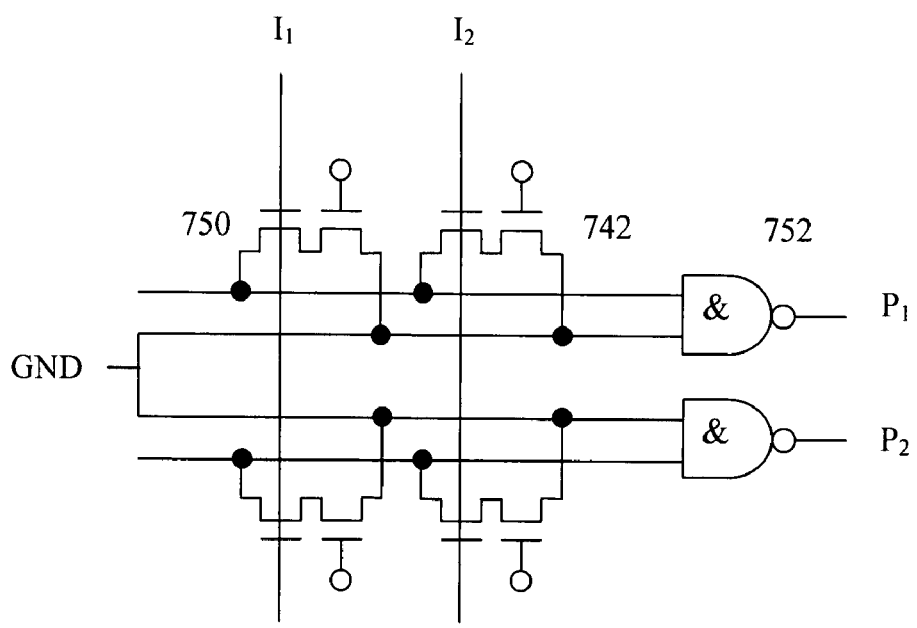
FIG. 7B shows P-term configuration for SRAM/hardwired PLD architecture.

In yet other embodiments, the circuit block 204 contains a RAM/ROM logic block consisting of "logic element tree" or "P-Term logic array" blocks that perform logic functions. FIG. 7A shows one such NAND EEPROM implementation of a P-Term in NAND-NOR logic array, while FIG. 7B shows the same P-term configuration for either SRAM, or hard-wired PLD architectures. FIG. 7A shows two mirrored outputs P1 and P2. For output P1, an AND gate 732 receives signals from pass transistors 722, 724, 728 and 730. The pass transistor 722 is controlled by block 720 shown in the dashed circle, while the pass transistor 728 is controlled by block 726 shown inside the dashed circle. Similarly, the upper half of FIG. 7B includes an AND gate 752 that receives inputs from pass transistors 742, 744, 748 and 750, respectively.

Figure 8A:
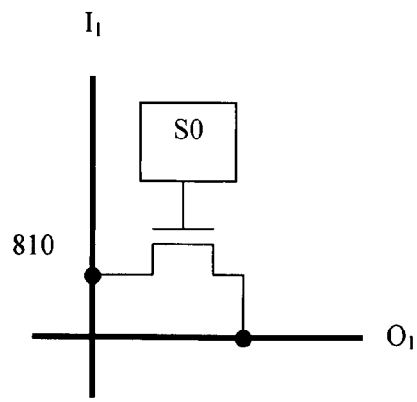
FIG. 8A shows an exemplary pass-gate logic element.
Figure 8B:
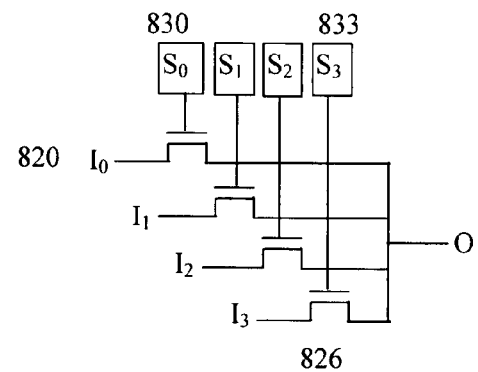
FIG. 8B shows an exemplary 4-Input logic MUX.

FIG. 8A shows exemplary pass-gate logic 810 connecting one input to one output. The NMOS pass gate voltage level S0 determines an ON and OFF connection. FIG. 8B shows exemplary 4-Input logic MUX implementing an output function O where $O=I0*S0+I1*S1+I2*S2+I3*S3$. In the MUX, only one of S0 870, S1 872, S2 874, S3 876 has a logic one. The MUX is constructed by combining four NMOS pass gate logic elements 820-826, each pass-gate as shown in FIG. 8A.

Figure 8C:
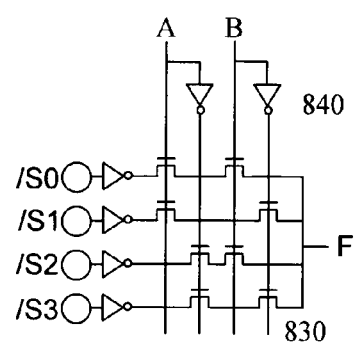
FIG. 8C shows an exemplary 2-Input Truth Table (Look-Up-Table).

FIG. 8C shows exemplary 2-input truth table logic (or also known as 2-input look-up-table logic) realization of an output function F where, $$F=/A*/B*S0+/A*B*S1+A*/B*S2+A*B*S3 \text{ (/A means not } A\text{)}.$$

The truth table logic (LUT) values are represented by S0, S1, S2 and S3. The realization is done through six inverters collectively designated 840 and eight pass transistors collectively designated 830. Logic values are stored in 4 programmable registers. These programmable registers are contained in the configuration circuits as part of configuration memory.

Figure 9:
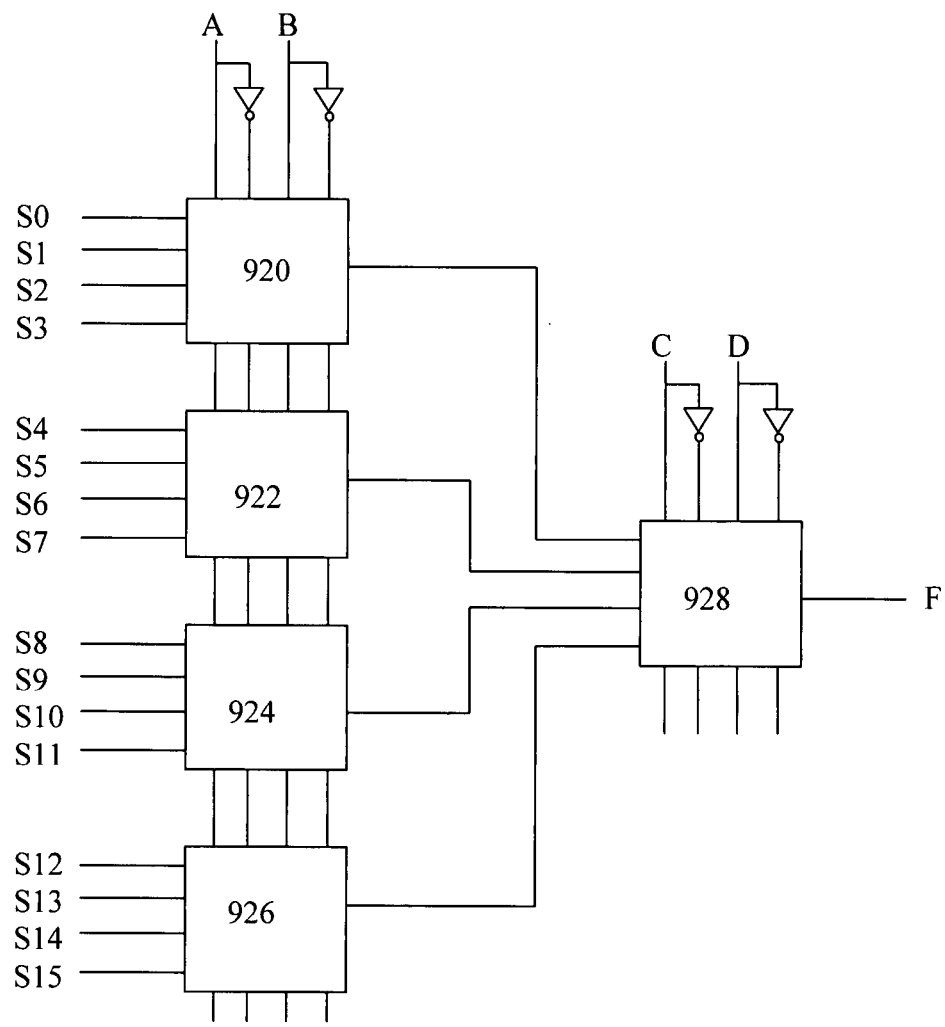
FIG. 9 shows a logic tree implementation of a 4-Input Truth Table (LUT).

FIG. 9 shows a logic tree constructed with five 2-input truth table logic (LUT) blocks 920-928 to perform a full four input truth table. A four input truth table has 16 possible logic values S0, S1, . . . , S15. As the number of inputs grow to N, this logic tree construction requires $2^N$ logic values, and $2^{(N-1)}$ branches in the logic tree. For large N values, a full truth table realization is less efficient compared to a partial product term AND-OR array realization.

In another embodiment, the programmable logic block can be a programmable microprocessor block. The microprocessor can be selected from third party IP cores such as: 8051, Z80, 68000, MIPS, ARM, and PowerPC. These microprocessor architectures include superscalar, Fine Grain Multi-Threading (FGMT) and Simultaneous Multi-Threading (SMT) that support Application Specific Packet Processing (ASPP) routines. To handle Programmable Network Interface (PNI) the processor can contain hardware and software configurability. Hardware upgradeability can be greatly enhanced in microprocessors embedded in PLD's by making use of the available logic content of the PLD device. Programmable features can include varying processor speed, cache memory system and processor configuration, enhancing the degree of Instruction Level Parallelism (ILP), enhancing Thread level parallelism (TLP). Such enhancements allow the user to optimize the core processor to their specific application. Cache parameters such as access latency, memory bandwidth, interleaving and partitioning are also programmable to further optimize processor performance and minimize cache hit miss rates. Additionally, the processor block can be a Very Long Instruction Word (VLIW) processor to handle multimedia applications. The processor block can include a cache controller to implement a large capacity cache as compared with an internal cache.

While a PLD can be configured to do DSP functions, the programmable logic block can also contain a digital signal processor (DSP), which is a special purpose processor designed to optimize performance for very high speed digital signal processing encountered in wireless and fiber-optic networks. The DSP applications can include programmable content for cache partitioning, digital filters, image processing and speech recognition blocks. These real-time DSP applications contain high interrupt rates and intensive numeric computations best handled by hardware blocks. In addition, the applications tend to be intensive in memory access operations, which may require the input and output of large quantities of data. The DSP cache memory may be configured to have a "Harvard" architecture with separate, independent program and data memories so that the two memories may be accessed simultaneously. This architecture permits an instruction and an operand to be fetched from memory in a single clock cycle. A modified Harvard architecture utilizes the program memory for storing both instructions and operands to achieve full memory utilization. The program and data memories are often interconnected with the core processor by separate program and data buses. When both instructions and operands (data) are stored in a single program memory, conflicts may arise in fetching data with the next instruction. Such conflicts have been resolved in prior art for DSP's by providing an instruction cache to store conflicting instructions for subsequent program execution.

In yet another embodiment, programmable logic block can contain software programmability. These software functions are executed in DSP, ARM, or MIPS type inserted IP cores, or an external host CPU. Accelerators connected by a configurable SRAM switching matrix enhance the computation power of the processors. The microprocessor has local permanent SRAM memory to swap, read, and write data. The switch matrix is pre-designed to offer both hard-wire and programmable options in the final ASIC. In this situation, the circuit block 104 can be a functional block that performs well-defined, commonly-needed function, such as special D/A or A/D converter, standard bus interface, or such block that implements special algorithms such as MPEG decode. The special algorithms implemented can be hardware versions of software. For example, algorithms relating to digital radio or cellular telephone such as WCDMA signal processing can be implemented by the functional block. Other functional blocks include PCI, mini-PCI, USB, UART blocks that can be configured by specifying the SRAM logic blocks.

In yet another embodiment, the circuit block 204 can be memory such as a register file, cache memory, static memory, or dynamic memory. A register file is an array of latches that operate at high speed. This register length counter may be programmable by the user. A cache memory has a high access throughput, short access latency and a smaller capacity as compared with main memory. The cache memory may be programmable to partition between the different requirements of the system design. One such need is the division between L1 and L2 cache requirements for networking applications. The memory can also be static random access memory or (SRAM) device with an array of single port, or multi-port addressable memory cells. Each cell includes a four transistor flip-flop and access transistors that are coupled to input/output nodes of the flip-flop. Data is written to the memory cell by applying a high or low logic level to one of the input/output nodes of the flip-flop through one of the access transistors. When the logic level is removed from the access transistor, the flip-flop retains this logic level at the input/output node. Data is read out from the flip-flop by turning on the access transistor. The memory can also be dynamic random access memory (DRAM). Generally, a DRAM cell consists of one transistor and a capacitor. A word line turns on/off the transistor at the time of reading/writing data stored in the capacitor, and the bit line is a data input/output path. DRAM data is destroyed during read, and refresh circuitry is used to continually refresh the data. Due to the low component count per bit, a high density memory device is achieved.

In another embodiment, the circuit block 204 can be an intellectual property ("IP") core which is reusable for licensing from other companies or which is taken from the same/previous design. In core-based design, individual cores may be developed and verified independently as stand-alone modules, particularly when IP core is licensed from external design source. These functions are provided to the user as IP blocks as special hardware blocks or pre-configured programmable logic blocks. The IP blocks connect via a programmable switching matrix to each other and other programmable logic. The hardware logic block insertion to any position in a logic sequence is done through the configurable logic matrix. These hardware logic blocks offer a significant gate count reduction on high gate count frequently used logic functions, and the user does not require generic "logic element" customization. In both cases, the user saves simulation time, minimize logic gate count, improve performance, reduce power consumption and reduce product cost with pre-defined IP blocks. The switch matrix is replaced by hardwires in the final ASIC.

The circuit blocks 204 can also be an array of programmable analog blocks. In one embodiment, the analog blocks include programmable PLL, DLL, ADC and DAC. In another embodiment, each block contains an operational amplifier, multiple programmable capacitors, and switching arrangements for connecting the capacitors in such as a way as to perform the desired function. Switched capacitor filters can also be used to achieve an accurate filter specification through a ratio of capacitors and an accurate control of the frequency of a sampling clock. Multiple PLL's can be programmed to run at different frequencies on the same chip to facilitate SoC applications requiring more than one clock frequency.

The circuit blocks 204 also contain data fetch and data write circuitry required to configure the configuration circuits 208. This operation may be executed by a host CPU residing in the system, or the PLD device itself. During power up, these circuits initialize and read the configuration data from an outside source, either in serial mode or in parallel mode. The data is stored in a predefined word length locally and written to the configurability allocation. The programmed configuration data is verified against the locally stored data and a programming error flag is generated if there is a mismatch. These circuits are redundant in the conversion of the PLD to an ASIC. However, these circuits are used in both FPGA and ASIC for test purposes, and has no cost penalty. A pin-out option has a "disable" feature to disconnect them for the customer use in the FPGA and ASIC.

Configuration circuits 208 provide active circuit control over digital circuits 204. One embodiment of the configuration circuit includes an array of memory elements. The user configuration of this memory amounts to a specific bitmap of the programmable memory in a software representation.

Suitable memory elements include volatile or non volatile memory elements. In non-volatile memory (NVM) based products, configurable data is held in one of metal link fuse, anti-fuse, EPROM, Flash, EEPROM memory element, or ferro-electric elements, resistance modulating elements, photo-electric elements, magneto-electric elements or any other property altering element. Some memory elements are one time programmable (OTP), while others can be programmed multiple times. An EPROM requires UV light to erase data. Flash & EEPROM's lend to in-system programmability (ISP). In volatile products, the configurable data storage can be SRAM cells or DRAM cells. With DRAM cells, the data requires constant refresh to prevent losses from leakages. Additionally, one or more redundant memory cells controlling the same circuit block can be used to enhance device yield.

The components of the memory element array can be a resistor, capacitor, transistor or a diode. In another embodiment of the configuration circuit, a memory element can be formed using thin film deposition. The memory element can be a thin film resistor, thin film capacitor, thin film transistor (TFT) or a thin film diode or a group of thin film devices connected to form an SRAM cell.

This discussion is mostly on SRAM elements and can easily extend to include all other programmable elements. In all cases, the design needs to adhere to rules that allow programmable module elimination, with no changes to the base die, a concept not used in PLD, FPGA, Gate Array and ASIC products today.

Figure 10:
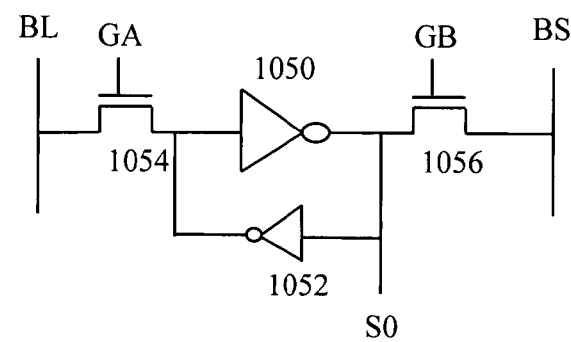
FIG. 10 shows an exemplary 6T SRAM.

An exemplary 6T SRAM cell, shown in FIG. 10, needs no high voltage capability, nor added process complexity. The cell of FIG. 10 has two back-to-back inverters 1050-1052 whose access is controlled by pass transistors 1054-1056. In addition, R-load & Thin Film Transistor (TFT) load PMOS based SRAM cells can be used for PLDs and FPGAs. To achieve zero stand-by power by eliminating sensing circuitry, and reduce memory element count for low input functions, these SRAM cells are embedded in truth table logic (also called Look-Up-Table) based architectures.

Figure 11:
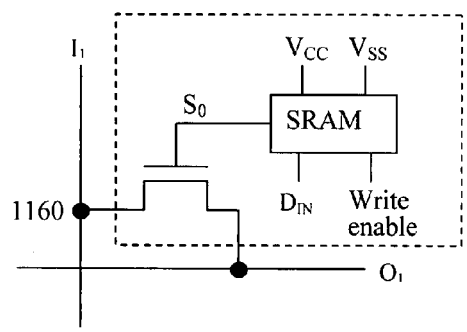
FIG. 11 shows pass gate transistor logic controlled by SRAM.
Figure 12:
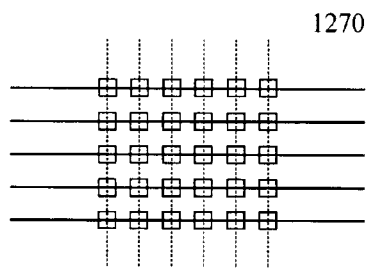
FIG. 12 shows one embodiment of a 5×6 switch matrix.
Figure 13:
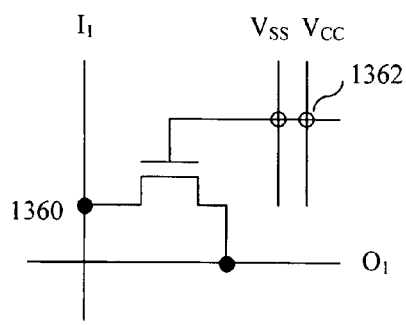
FIG. 13 shows pass gate controlled by Vcc (power) or Vss (ground)

Pass gate transistor logic 1160 controlled by SRAM is shown in FIG. 11. In this embodiment, the memory cell (such as the cell of FIG. 10) drives the pass transistor 1160 to affect an outcome. A 5×6-switch point matrix 1270 controlled by 30-SRAM cells coupled to 30-NMOS pass gates is shown in FIG. 12. FIG. 13 shows the NMOS pass gate 1360 logic controlled by the SRAM in FIG. 11 converted to hard-wire logic. A contact 1362, connected to Vcc (logic 1) or Vss (logic 0) depending on the SRAM logic content, replace the SRAM cell. The SRAM logic mapping to hard wire connections are automatic and done by a software program that is verifiable against the bit-map.

Figure 14:
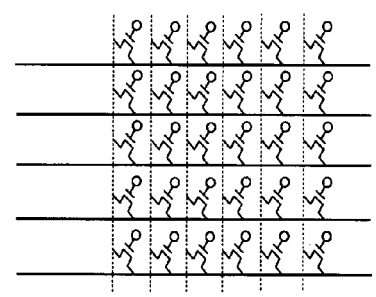
FIG. 14 shows the 5×6 switch matrix

Similarly, FIG. 14 shows the 5×6-switch point matrix 1470 hard-wired by replacing the SRAM bits that control NMOS gates with hard-wires to Vcc or Vss. In FIG. 14, the bubble may represent either SRAM or hard-wire Vcc or Vss control on NMOS pass gates. In the case of Fuse or Antifuse arrays, contact or no contact between the two metal lines in FIG. 11 or 13 directly replaces the programmable element and there is no NMOS pass-gate needed.

The P-Term logic builds the core of PLD's and complex PLD's (CPLD's) that use AND-OR blocks 202-204 (or equivalent NAND-NOR type logic functions) as shown in the block diagram of FIG. 5 and one expansion is shown in FIG. 6B with AND gates 610 and OR gates 612. Gate implementation of two inputs (I1, I2) and two P-terms (P1, P2) NAND function can be single poly EEPROM bits as shown in FIG. 6B. The dotted circle contains the charge trapping floating gate, the programming select transistor, tunneling diode, a control gate capacitor and programming access nodes. The SRAM cell replaces that entire circle in this invention as detailed next. The SRAM NAND-NOR array (also AND-OR array) replacement has not been realized in prior art as SRAM cells require Nwell & Pwell regions that consume large silicon area to prevent latch-up. The SRAM in TFT do not have well related constraints as NMOS and PMOS bodies are isolated from each other. Keeping the two pass gates in silicon layers and moving SRAM to TFT layers allow P-Term logic implementation with SRAM cells and subsequent replacement with hard-wires. In TFT SRAM conversion to final ASIC, the bubble on NMOS gate becomes a hard-wire connection to Vcc or Vss.

The length of input and output wires, and the drive on NMOS pass gates and logic gate delays determine the overall PLD delay timing, independent of the SRAM cell parameters. By moving SRAM cell to TFT upper layers, the chip X,Y dimensions are reduced over 20% to 50% compared to traditional SRAM FPGA's, providing a faster logic evaluation time. In addition, removal of SRAM cell later does not alter lateral wire length, wire loading and NMOS pass gate characteristic. The vertical dimension change in eliminating the memory module is negligible compared to the lateral dimension of the ASIC, and has no impact on timing. This allows maintaining identical timing between the FPGA and ASIC implementations with and without the SRAM cells. The final ASIC with smaller die size and no SRAM elements have superior reliability, similar to an ASIC, leading to lower board level burn-in and field failures compared to PLD's and FPGA's in use today.

Next, the wiring and/or routing circuit 522 in FIG. 5A is discussed. The wiring and/or routing circuit connects each logic block to each other logic block. The wiring/routing circuit allows a high degree of routing flexibility per silicon area consumed and uniformly fast propagation of signals, including high-fanout signals, throughout the device. The wiring module may contain one or more levels of metal interconnect.

One embodiment of a switch matrix is a 6×5 programmable switch-matrix with 30 SRAM bits (or 30 Anti-fuses, or 30 fuses), shown in FIG. 12. The box in FIG. 12 contains the SRAM cell shown inside dotted box of FIG. 11, where the pass gate makes the connection between the two wires, and the SRAM bit holds the configuration data. In this configuration, the wire connection in circuit layer 212 occurs via a pass transistor located in circuit 214 controlled by an SRAM cell in circuit 218. During power-up, a permanent non-volatile memory block located in the system, loads the correct configuration data into SRAM cells. In Fuse or Anti-fuse applications, the box simply represents the programmable element in circuit 218 between the two wires in circuit layer 212. During the ASIC conversion this link is replaced with an open or short between the wires.

Another embodiment provides short interconnect segments that could be joined to each other and to input and output terminals of the logic blocks at programmable interconnection points. In another embodiment, direct connections to adjacent logic blocks can be used to increase speed. For global signals that traverse long distances, longer lines are used. Segmented interconnect structures with routing lines of varied lengths can be used. In yet other embodiments, a hierarchical interconnect structure provides lines of short lengths connectable at boundaries to lines of longer lengths extending between the boundaries, and larger boundaries with lines of even longer length extending between those boundaries. The routing circuit can connect adjacent logic blocks in two different hierarchical blocks differently than adjacent logic blocks in the same hierarchical block. Alternatively, a tile-based interconnect structure can be used where lines of varying lengths in which each tile in a rectangular array may be identical to each other tile. In yet another implementation, the interconnect lines can be separated from the logic block inputs by way of a routing matrix, which gives each interconnect line more flexible access to the logic block inputs. In another embodiment, interconnect routing is driven by programmable buffers. Long wire lengths can be subdivided into smaller length segments with smaller buffers to achieve a net reduction in the overall wire delay, and to obtain predictable timing in the logic routing of the PLD.

Next, a brief description of the manufacturing process is discussed. During one embodiment of manufacturing, one or more digital circuits can be formed on a substrate. Next, the process selectively fabricates either a memory circuit or a conductive pattern substantially above the digital circuits to control portion of digital circuits. Finally, the process fabricates interconnects and routing wires substantially above the digital circuits and memory circuits to connect digital circuits and one of the memory circuit or the conductive pattern. In another embodiment of manufacturing, one or more digital circuits can be formed on a substrate. Next, the process fabricates interconnects and routing wires substantially above the digital circuits, further providing connection points for configuration circuits to couple into digital circuits. Then, the process selectively fabricates either a memory circuit or a conductive pattern substantially above interconnects to control a portion of digital circuits. Either the memory or the conductive pattern programs the FPGA or the ASIC respectively.

The process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns. The memory circuit and the conductive pattern have one or more substantially matching circuit characteristics. In this case, timing characteristics substantially unchanged by the circuit control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics. In another embodiment, the hard-wire ASIC option may be incorporated into the digital circuit layer 102. In another embodiment, the hard-wire ASIC option is incorporated into the routing layer 110.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A semiconductor device, comprising:
a plurality of pads having first predetermined positions;
a first layer including a plurality of circuit blocks having second predetermined positions, at least one of said circuit blocks coupled to one of said pads; and
a second layer positioned above or below the first layer including a memory array coupled to one or more of said circuit blocks, wherein the second layer comprises a plurality of configurations with the same first and second predetermined positions of pads and circuit blocks, respectively, and wherein
a first fabricating configuration comprises a user programmable memory array, and
a second fabricating configuration comprises a mask programmable memory array in lieu of the user programmable memory array.

2. The method of claim 1, wherein the circuit blocks include programmable logic circuits and the memory array comprises memory elements, at least one of the memory elements is coupled to one programmable logic circuit to configure the programmable logic circuit.

3. The method of claim 1, wherein said memory array configuration comprises a field programmable memory array to form an FPGA.

4. The method of claim 1, wherein said memory array configuration comprises a mask programmable metal pattern to form an ASIC.

5. The method of claim 1, wherein one pad is coupled to power or ground supply voltage.

6. The method of claim 1, wherein one pad is coupled to an Input/Output (I/O) circuit block in the first layer, the I/O having an I/O characteristic invariant to memory array configurations.

7. The method of claim 1, wherein the pads are coupled to leads of a package.

8. The method of claim 1, wherein the first layer includes one or more input buffers to receive data from one or more of said pads to program the memory array in a said memory array configuration.

9. The method of claim 1, wherein a said memory array configuration comprises one or more of: fuses, antifuses, SRAM cells, DRAM cells, metal optional links, EPROMs, EEPROMs, flash, resistance modulating elements, magneto-electric elements, photo-electric elements and ferro-electric elements.

10. The method of claim 1, wherein the first layer comprises circuits to request configuration data from an external storage device for a said memory array configuration.

11. A three dimensional semiconductor device, comprising:
a plurality of circuit blocks including programmable logic blocks having predetermined positions within the device;
a plurality of pads surrounding the circuit blocks; and
a configuration memory circuit coupled to the programmable logic blocks having a plurality of fabrication configurations, each configuration fabricated with the same predetermined positions of the circuit blocks and pads, and wherein
a first fabricating configuration comprises a user programmable memory array, and
a second fabricating configuration comprises a mask programmable memory array in lieu of the user programmable memory array.

* * * * *